United States Patent
Luo et al.

(10) Patent No.: US 7,619,718 B2
(45) Date of Patent: Nov. 17, 2009

(54) METHOD AND SYSTEM FOR ACTIVE PURGING OF PELLICLE VOLUMES

(75) Inventors: Florence Luo, Valley Cottage, NY (US);
Herman Vogel, Sandy Hook, CT (US);
George H Harrold, Redding, CT (US);
Nicolaas ten Kate, Almkerk (NL)

(73) Assignee: ASML Holding N.V., Veldhoven (NL)

( * ) Notice: Subject to any disclaimer, the term of this patent is extended or adjusted under 35 U.S.C. 154(b) by 1319 days.

(21) Appl. No.: 10/679,324

(22) Filed: Oct. 7, 2003

(65) Prior Publication Data
US 2005/0074352 A1 Apr. 7, 2005

(51) Int. Cl.
*G03B 27/62* (2006.01)
(52) U.S. Cl. ............................. 355/75; 355/53
(58) Field of Classification Search ............ 355/53, 355/75; 378/34, 35; 206/454
See application file for complete search history.

(56) References Cited

U.S. PATENT DOCUMENTS

| | | | |
|---|---|---|---|
| 6,436,586 B1 * | 8/2002 | Matsuoka et al. | 430/5 |
| 6,593,034 B1 * | 7/2003 | Shirasaki | 430/5 |
| 6,803,996 B2 | 10/2004 | Kamono | |
| 6,833,903 B2 | 12/2004 | Kamono | |
| 2001/0026355 A1 * | 10/2001 | Aoki et al. | 355/30 |
| 2002/0057425 A1 * | 5/2002 | Nakano | 355/72 |
| 2002/0126269 A1 * | 9/2002 | Sato | 355/77 |
| 2003/0035222 A1 * | 2/2003 | Okada et al. | 359/629 |
| 2003/0136512 A1 | 7/2003 | Yamomoto | |
| 2003/0150329 A1 * | 8/2003 | Kamono | 95/291 |
| 2004/0119965 A1 * | 6/2004 | Powers | 355/75 |

FOREIGN PATENT DOCUMENTS

| | | |
|---|---|---|
| JP | 2001-345264 A | 12/2001 |
| JP | 2003-167328 A | 6/2003 |

(Continued)

OTHER PUBLICATIONS

Translation of Office Action and Office Action for Patent Application No. 2004-295412 mailed Mar. 24, 2008, 4 pgs.

(Continued)

*Primary Examiner*—Diane I Lee
*Assistant Examiner*—Steven H Whitesell-Gordon
(74) *Attorney, Agent, or Firm*—Sterne, Kessler, Goldstein & Fox P.L.L.C.

(57) ABSTRACT

The present invention provides methods and systems for fast purging of pellicle volumes. A purge device has a base which is enclosed in a controlled environment filled with purge gas. The base has a cavity formed on a surface therein. The cavity receives a reticle-pellicle assembly including a pellicle surface and an enclosed pellicle volume. A first region within the cavity can be formed to hold purging gas at a high pressure. A gap region is formed below the pellicle within the cavity. A displacement force on the pellicle due to a pressure difference between purging gas in the enclosed volume and purging gas in the gap region is kept within a tolerance range of the pellicle. According to further embodiments, a purge device is provided that includes a flow barrier (e.g., non-contacting and/or contacting barriers). A pressure balancing plate and/or flow resistant plates are provided in a purge device.

25 Claims, 13 Drawing Sheets

Side View

FOREIGN PATENT DOCUMENTS

| | | |
|---|---|---|
| JP | 2003-209042 A | 7/2003 |
| JP | 2003-228163 A | 8/2003 |
| WO | WO 03/034475 A1 | 4/2003 |

OTHER PUBLICATIONS

English Translation of Japanese Patent Publication No. JP 2003-209042 A published Jul. 25, 2003, 20 pgs.

English Translation of Japanese Patent Publication No. JP 2003-228163 A published Aug. 15, 2003, 24 pgs.

English abstract of Japanese Patent Publication No. JP 2003-167328 A, 1 page, dated: Jun. 13, 2003.

English abstract of Japanese Patent Publication No. JP 2001-345264 A, 1 page, dated: Dec. 14, 2001.

* cited by examiner

Side View

Perspective View - With Corner Jets

A Perspective View - With Corner Jets and Bottom Jets

Fingers in high pressure region
Finger shown is activated by purging gas

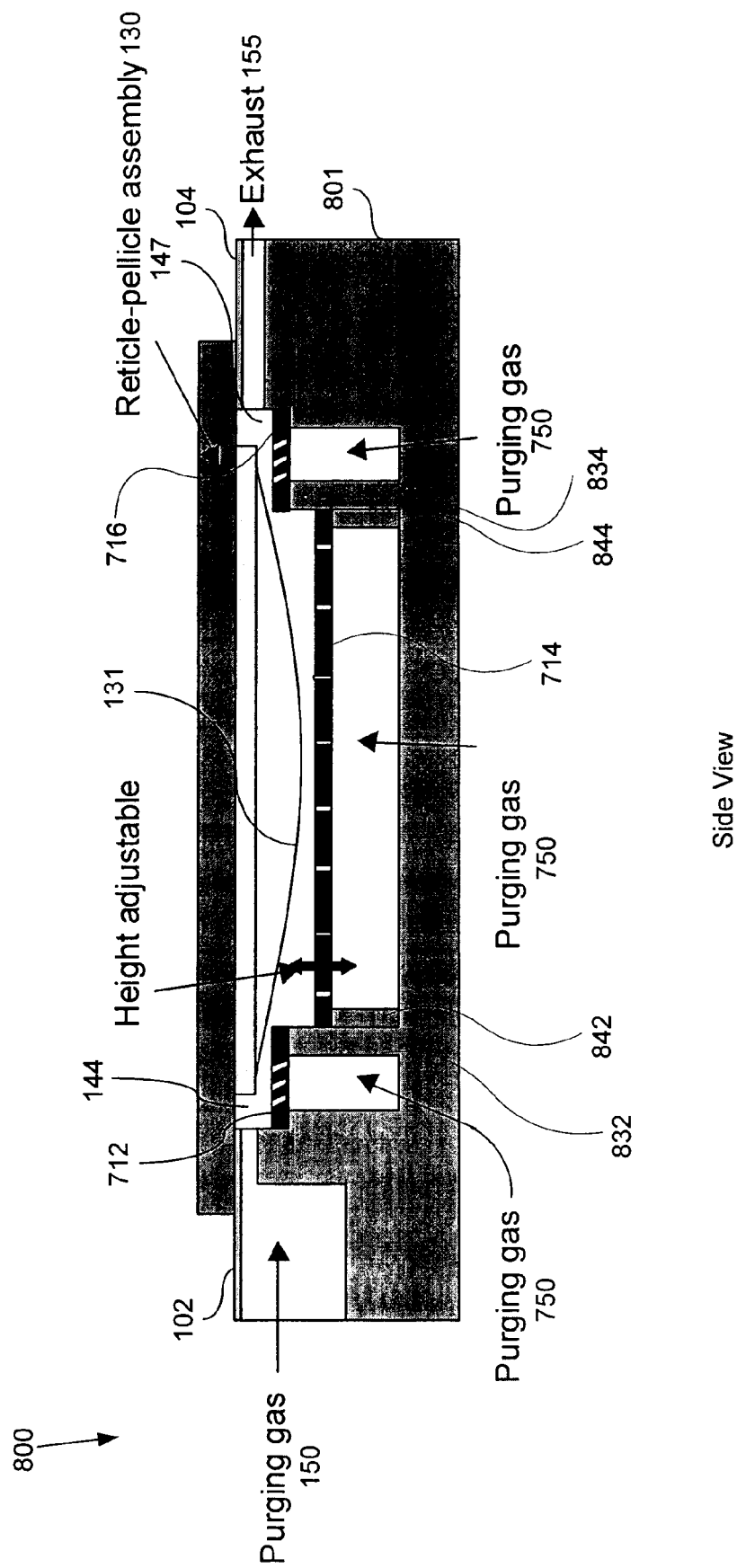

METHOD AND SYSTEM FOR ACTIVE PURGING OF PELLICLE VOLUMES

BACKGROUND OF THE INVENTION

1. Field of the Invention

The present invention relates to purging, and in particular to purging pellicle volumes in lithography.

2. Related Art

In lithography, a reticle is often protected by a pellicle. A pellicle is mounted on a stand-off (also called a pellicle frame) from the reticle. The space enclosed by a reticle, a pellicle frame, and a pellicle, is called the pellicle volume. In some lithographic applications, such as 157 nm wavelength exposure applications, a pellicle volume needs to be purged and filled with a certain quality of a certain gas before the reticle can be exposed. For example, in 157 nanometer (nm) applications, nitrogen (pure or nearly pure) is often used to fill a pellicle volume before a reticle can be exposed for printing patterns on wafers.

To accomplish purging of a pellicle volume, gas can passively diffuse into the pellicle volume space. Such passive gas diffusion, however, takes a long time to achieve a required gas concentration and purity in the pellicle volume. Active purging, where gas is directed to a pellicle volume, has been done at low pressure levels which takes a relatively long time to purge a given volume. Such delay reduces productivity and increases the overall lithographic manufacturing process time. Active purges have been limited to low pressures to protect a pellicle. Faster purging of a pellicle volume requires higher pressures that can exert excessive stress on a pellicle.

A pellicle can be made out of hard or soft materials. Hard pellicles are often made out of glass. Soft pellicles are often made out of organic membranes or other flexible materials. Regardless of material type, pellicles are often thin. As a result, many pellicles are vulnerable to stress—especially due to a displacement force on a plane of the pellicle. Fast purging of a pellicle volume at high pressure can exert excessive stress on a pellicle causing damage and possibly rupture. This problem even limits fast purging of flexible pellicles since they may be stretched and unable to return to their original shape.

Fast purging is made even more difficult by the poor permeability of many pellicle frames. Pellicle frames have been made of materials which are solid or nearly impermeable to gas flow to prevent particles from entering the pellicle volume. Impermeability to gas makes solid pellicle frames unsuited for applications where a pellicle volume must be purged. Gas-permeable materials are increasingly being used in pellicle frames to allow the pellicle volume to be purged. Such gas-permeable pellicle frames are still somewhat restrictive to purging flows, since the material must also act as a particle barrier. As a result, higher pressures must be applied to purge a pellicle volume quickly.

What is needed is a method and system for fast purging of pellicle volumes in lithography that can quickly and reliably purge pellicle volumes without causing undue stress or damage to a pellicle.

SUMMARY OF THE INVENTION

The present invention provides methods and systems for fast purging of pellicle volumes. A purge device is provided for actively purging a pellicle volume enclosed within a reticle-pellicle assembly. The reticle-pellicle assembly has a reticle, a pellicle, and a gas permeable pellicle frame. The gas permeable pellicle frame supports the pellicle at a standoff from the reticle. In embodiments, the purge device includes a base that is inside a controlled environment filled with the preferred purge gas. The base has a cavity, a purge gas input interface and/or a purge gas output interface. The cavity receives at least a portion of a reticle-pellicle assembly including a pellicle and the enclosed pellicle volume such that first and second regions within the cavity are formed at the purge gas input and output interfaces. A narrow gap region is formed below the pellicle surface within the cavity. Other gap regions may form between the cavity wall and the sides of the pellicle frame. These gaps are preferably narrow. A purging gas sent through the purge input interface is kept at a higher pressure in the first region relative to the second region. The purging gas flows from the higher pressure first region toward the second region through the enclosed pellicle volume and the gap region(s). In this way, the pellicle volume is purged and filled with purging gas.

In an embodiment, the base includes one or more support members that support and hold the reticle-pellicle assembly in place while purging. In one example, the support member(s) apply a sealed vacuum to a portion of the bottom side of the reticle to hold the reticle-pellicle assembly stationary relative to the base during purging.

A purge input interface includes one or more ports for passing the purging gas to the first region. A purge output interface includes one or more ports for passing exhaust out of the purge device. The purge input interface is supplied with gas positively pressured with respect to ambient pressure. The output interface is either connected to a vacuum source or the ambient.

According to further embodiments, high pressure in the first region is achieved by confining high pressured gas in this region with reticle-pellicle surfaces, cavity walls and flow barriers. For example, a flow barrier can keep the flow of the purging gas within the first region before entering the pellicle volume.

In preferred embodiments, the flow barrier is a non-contacting gas barrier that does not contact a reticle-pellicle assembly. In one implementation, the non-contacting gas barrier includes two groups of jets located at opposite corners of a base facing the cavity that direct additional purging gas toward opposite sides of the first region. An additional gas barrier can be located at the bottom of the cavity just behind the first region. The additional gas barrier can include another group of jets that shoot additional purging gas against a flow of purging gas going through the narrow gap under the pellicle. In one implementation, the high pressure in the first region is achieved only with the high-pressured jets from the non-contacting gas barriers and the first purge gas input interface is eliminated.

In other embodiments, the flow barrier is a contacting gas barrier. In one implementation, the contacting gas barrier includes two fingers that pivot between a closed and open position. A base includes two recesses for receiving the fingers at the closed or default position. One set of fingers is equipped at the purge input interface side. Another set of fingers is equipped at the output interface side, especially when the purge output interface is connected with vacuum.

In another implementation, the contacting gas barrier includes two seals. A base includes two recesses for receiving the seals at the closed position. One set of seals is equipped at the purge input interface. Another set seals is equipped at the purge output interface side when the purge output interface is connected with vacuum.

In a further aspect of the invention, a pressure balancing plate is provided in a purge device. The pressure balancing plate is positioned within the cavity of a base and extends parallel with a pellicle surface. A gap region is formed between a surface of the pressure balancing plate and the pellicle surface. In one example, the pressure balancing plate has a set of holes. The base includes one or more dividing walls that extend within the cavity to form one or more plenums below the set of holes in the pressure balancing plate. In this way, pressures in these plenums can be controlled independently to release different velocities of the purging gas across the gap region below the pellicle surface and stress on the pellicle can be minimized.

According to a further feature, the position of the pressure balancing plate can be adjusted relative to the pellicle surface. In one example, the height of one or more support members is varied to move the pressure balancing plate nearer or farther away from the pellicle surface.

In a further aspect of the invention, a purge device includes one or more flow resistant plates. In one example, a first flow resistant plate is arranged along a front of the gap region at or near a first high pressure region, while a second flow resistant plate is arranged along a back of the gap region at or near a second low pressure region. One or more dividing walls further extend within a cavity to form plenums below the first and second flow resistant plates. Pressure of a purging gas in these plenums can be controlled independently to provide desired flow resistance at different locations across the gap.

Further features and advantages of the present invention, as well as the structure and operation of various embodiments of the present invention, are described in detail below with reference to the accompanying drawings.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

FIG. 8 is a diagram of a purge device with a height-adjustable pressure balancing mechanism according to a further embodiment of the present invention.

Figure 1:
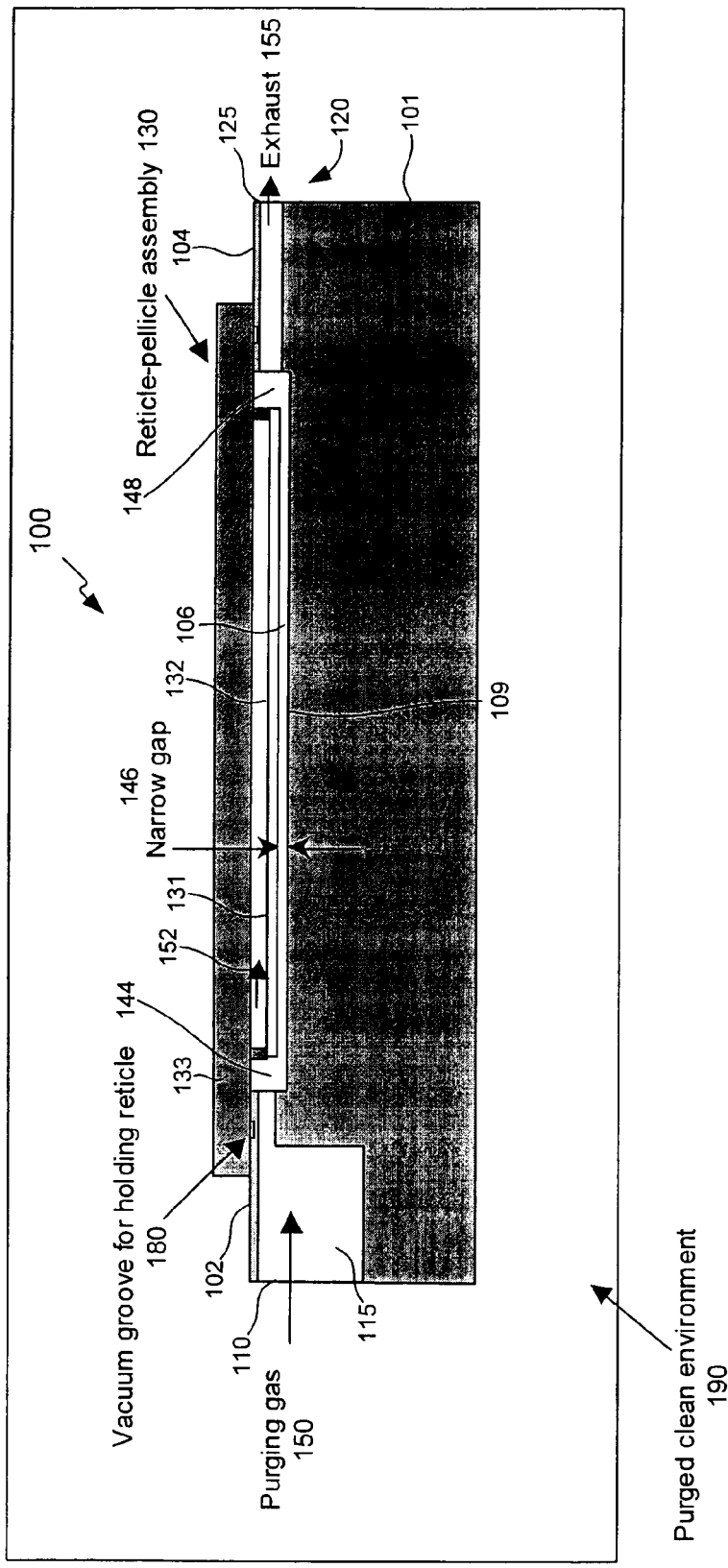
FIG. 1 is a diagram showing a side view of a purge device according to an embodiment of the present invention.

The present invention will now be described with reference to the accompanying drawings. In the drawings, like reference numbers can indicate identical or functionally similar elements. Additionally, the left-most digit(s) of a reference number may identify the drawing in which the reference number first appears.

DETAILED DESCRIPTION OF THE INVENTION

Overview

The present invention provides systems and methods for fast purging of pellicle volumes. In embodiments, purge devices are provided for actively purging a pellicle volume enclosed within a reticle-pellicle assembly.

Example Environment

The present invention can be used in any type of photolithographic system including, but not limited to, ultra-violet (UV) lithographic systems having an exposure wavelength of 157 nanometers (nm) or less. The present invention is not intended to be limited to UV lithographic systems and indeed can be used in other lithographic systems having exposure wavelengths greater or smaller than ultraviolet wavelengths as would be apparent to a person skilled in the art given this description. Further, the present invention is described with respect to fast purging; however, the present invention can be used in a passive purge process or slower active purge process, as desired in a particular application.

Purge Device

FIG. 1 is a cross-sectional diagram of a purge device 100 in a side view according to an embodiment of the present invention. Purge device 100 is disposed inside a controlled environment 190 that is filled with a desired purge gas. Any type of controlled environment can be used including, but not limited to, a gas chamber in a clean room.

Purge device 100 includes base 101 for receiving a reticle-pellicle assembly 130. Base 101 has a cavity 106 formed in a surface thereof. Cavity 106 receives at least a portion of reticle-pellicle assembly 130 including a pellicle 131 and an enclosed pellicle volume 132. A narrow gap region 146 is formed below a pellicle surface within cavity 106 as shown in FIG. 1.

Base 101 further includes a purge input interface 110 and purge output interface 120. (In other embodiments discuss below, purge input interface 110 and/or purge output interface 120 can be omitted). Purge input interface 110 includes one or more input ports 115 for passing purging gas 150 through to cavity 106. Purge output interface 120 includes one or more output ports 125 for passing exhaust 155 out from cavity 106. Any type of gas supply and handling system can be coupled to purge input interface 110 and purge output interface 120 to provide and remove purging gas 150. A gas supply system providing variable control of the pressure and flow rate of purging gas 150 can be used. In one example, purging gas 150 is nitrogen or nearly pure nitrogen. As would be apparent to a person skilled in the art given this description, any type of gas supply handling system that can provide nitrogen or nearly pure nitrogen at a controllable pressure can be used. In one example, purge output interface 120 is connected to a controllable vacuum supply.

In one embodiment, base 101 includes first and second support members 102, 104 with vacuum groove(s) 180 for holding reticle-pellicle assembly 130 with a vacuum seal during purging. First support member 102 is an upper surface of purge input interface 110 on base 101. Second support member 104 is an upper surface on purge output interface 120 of base 101. When reticle-pellicle assembly 130 is positioned in cavity 106, reticle-pellicle assembly 130 is supported such that a narrow gap region 146 is formed between a bottom surface of pellicle 131 and a top surface 109 of base 101. A first pressure region 144 is created between purge input interface 110 and reticle-pellicle assembly 130 within cavity 106. A second pressure region 148 is formed between reticle-pellicle assembly 130 and purge output interface 120 within cavity 106. Other gaps may form along the sides of reticle-pellicle assembly 130 between the walls of cavity 106 and side walls of a pellicle frame. During active purging of a pellicle volume 132 in reticle-pellicle assembly 130, purging gas 150 enters input port 115 and flows to first pressure region 144. Purging gas 150 is generally kept at a higher pressure in first pressure region 144 relative to second pressure region 148. Accordingly, purging gas 150 tends to flow along flow direction 152 between first pressure region 144 and second pressure region 148. Purging gas 150 then exits base 101 through output port 125 as exhaust 155.

According to a feature of the present invention, purging gas 150 flows through pellicle volume 132 to purge impurities or undesired gases from pellicle volume 132. To actively purge pellicle volume 132 at a fast rate, a higher pressure is desired within first region 144 applied against reticle pellicle assembly 130. Higher pressures increase the rate of which gas is purged from pellicle volume 132 and reduce the overall purge time. On the other hand, higher pressures within pellicle volume 132 can cause a displacement force on pellicle 131 that stretches or even ruptures pellicle 131. According to the present invention, however, because purging gas 150 can also flow through narrow gap region 146 between first pressure region 144 and second pressure region 148, differences in pressure between pellicle volume 132 and narrow gap region 146 on opposite sides of pellicle 131 are reduced or eliminated. In this way, displacement forces on pellicle 131 due to pressure differences between the purging gas in pellicle volume 132 and the purging gas in narrow gap region 146 is kept to within the tolerance range of pellicle 131.

Figure 2:
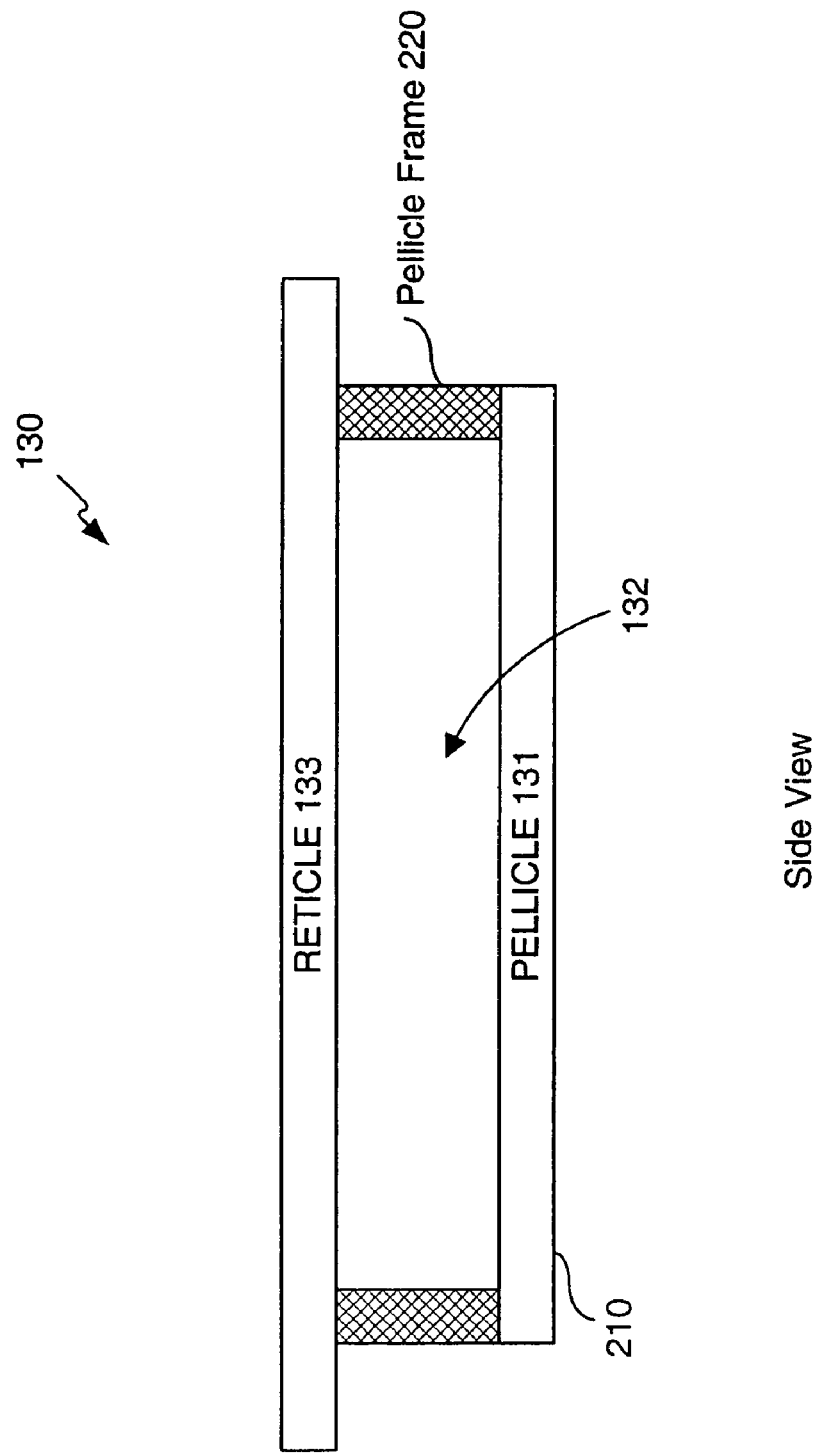
FIG. 2 is a diagram showing a side view of a reticle-pellicle assembly according to an embodiment of the present invention.

FIG. 2 is a cross-sectional diagram that shows reticle-pellicle assembly 130 in further detail. Reticle-pellicle assembly 130 includes reticle 133, pellicle 131 having a bottom surface 210, and pellicle frame 220. Pellicle frame 220 supports reticle 133 and pellicle 131 at a stand off with respect to one another such that an enclosed pellicle volume 132 is formed within reticle-pellicle assembly 130. Preferably, pellicle frame 220 is a porous frame that enables purging gas 150 to purge pellicle volume 132. In embodiments, pellicle frame 220 is gas permeable to gases, such as nitrogen or nearly pure nitrogen, yet is a barrier to particles or other solid particulate matter that may contaminate reticle 133. For example, pellicle frame 220 can include a porous filtering material, such as an organic membrane or porous sintered metal. For instance, pellicle frame 220 can be made from sintered Invar. In one example, pellicle frame 220 has four sides including at least two gas permeable sides facing the first and second pressure regions 144, 148. In another example, pellicle frame 220 has four sides including four gas permeable sides. In still another example, pellicle frame 220 has four sides including a first pair of opposing sides that are permeable to gas, and second pair of opposing sides that are impermeable to gas. The sides are arranged within cavity 106 such that the gas permeable sides in the first pair face first region 144 and second region 148, respectively, while the gas impermeable sides in the second pair lie between the first and second pressure regions 144, 148 and face side walls of cavity 106.

Reticle-pellicle assembly 130 is illustrative and not intended to limit the present invention. Purge devices according to the present invention can be used with any type of reticle-pellicle assembly having a pellicle volume that can be actively purged.

Flow Barriers

According to a further feature of the present invention, flow barriers are provided in purge device 100 to improve performance. Flow barriers can be non-contacting or contacting types of flow barriers, or any combination thereof.

Figure 3A:
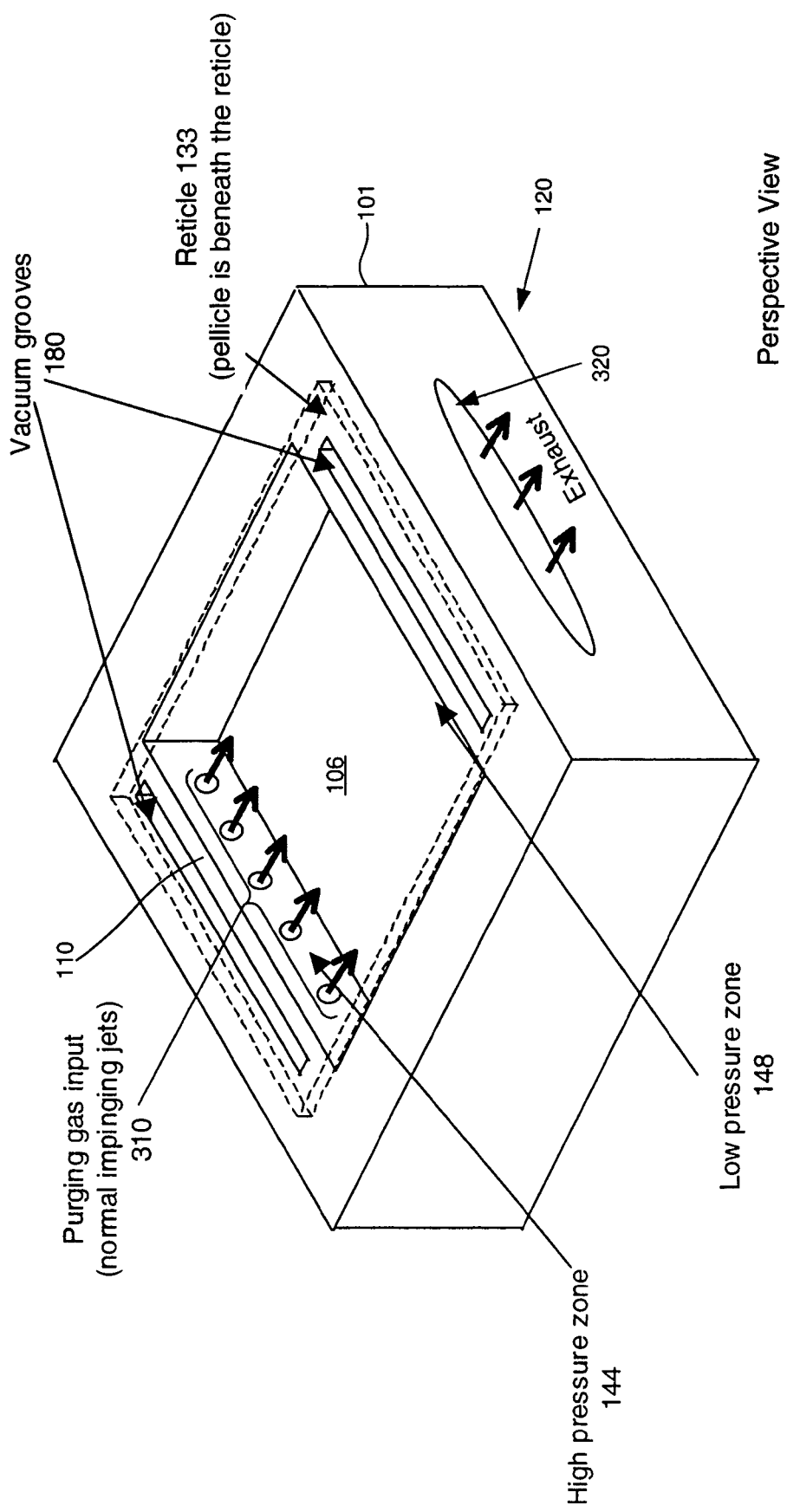
FIG. 3A is diagram showing a perspective view of a purging device according to a further embodiment of the present invention.

Consider a purge device base 101 having a purge input interface 110 with a plurality of jets 310 as shown in a perspective view in FIG. 3A. Jets 310 are generally aimed toward high pressure region 144. As described above, input purging gas will travel under reticle 133 from high pressure region 144 through pellicle volume 132 toward low pressure region 148 and exit output port 320 as exhaust. Side and/or bottom leakage can occur. Side leakage refers to part of the purging gas that may tend to exit out the sides of pressure region 144 (or region 148) toward side walls of cavity 106 rather than passing through pellicle volume 132. Bottom leakage refers to gas leaking out of the bottom of pressure region 144 along gap 146 underneath pellicle 131 rather than passing through pellicle volume 132. According to a feature of the present invention, flow barriers are provided to counter side and/or bottom leakage, help maintain a pressure difference between a first high pressure region 144 and a second lower pressure region 148 during active purging, and help direct an efficient flow of purging gas through pellicle volume 132.

Figure 3B:
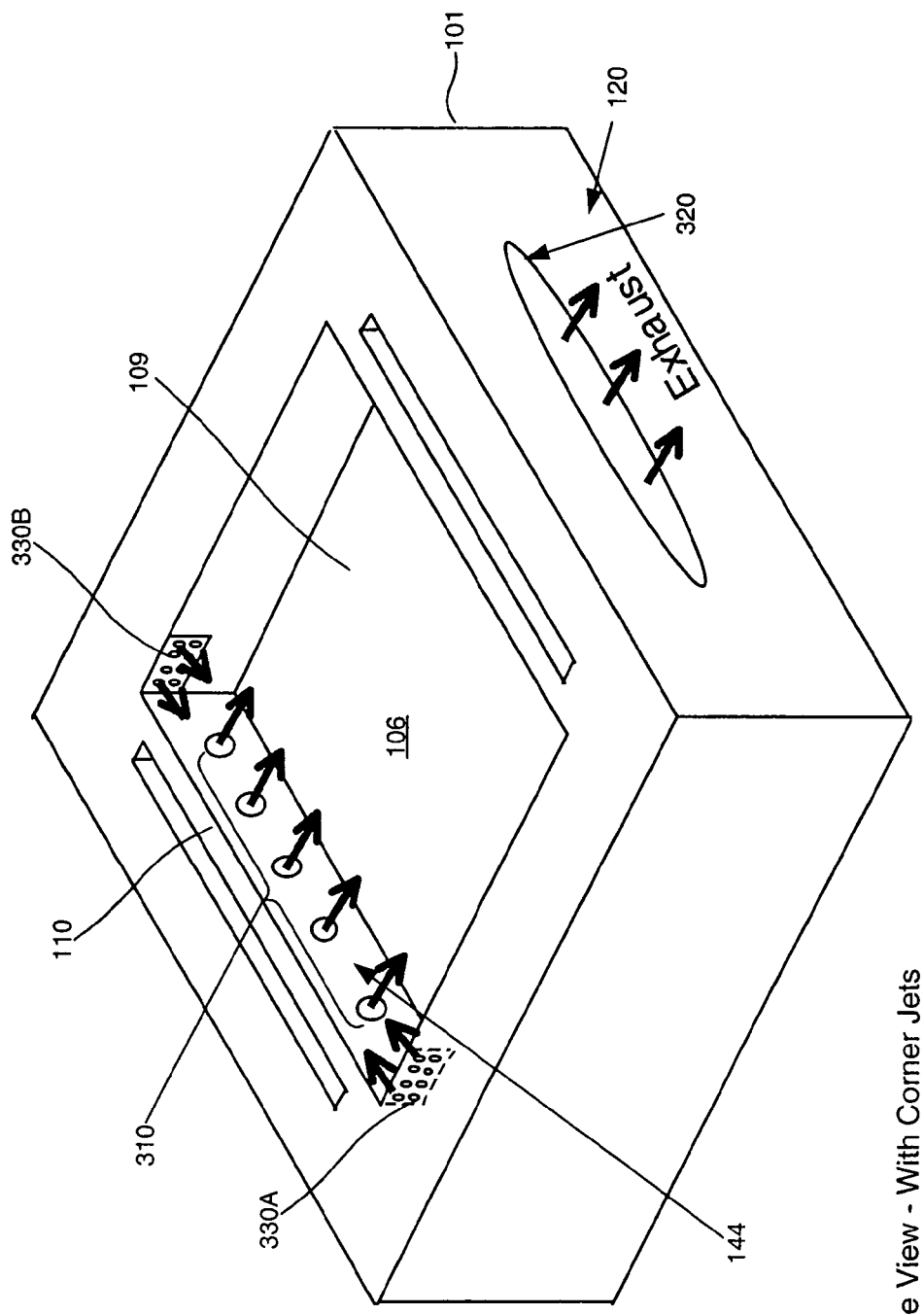
FIGS. 3B and 3C are diagrams showing perspective views of purging devices including non-contacting flow barriers according to further embodiments of the present invention.
Figure 3C:
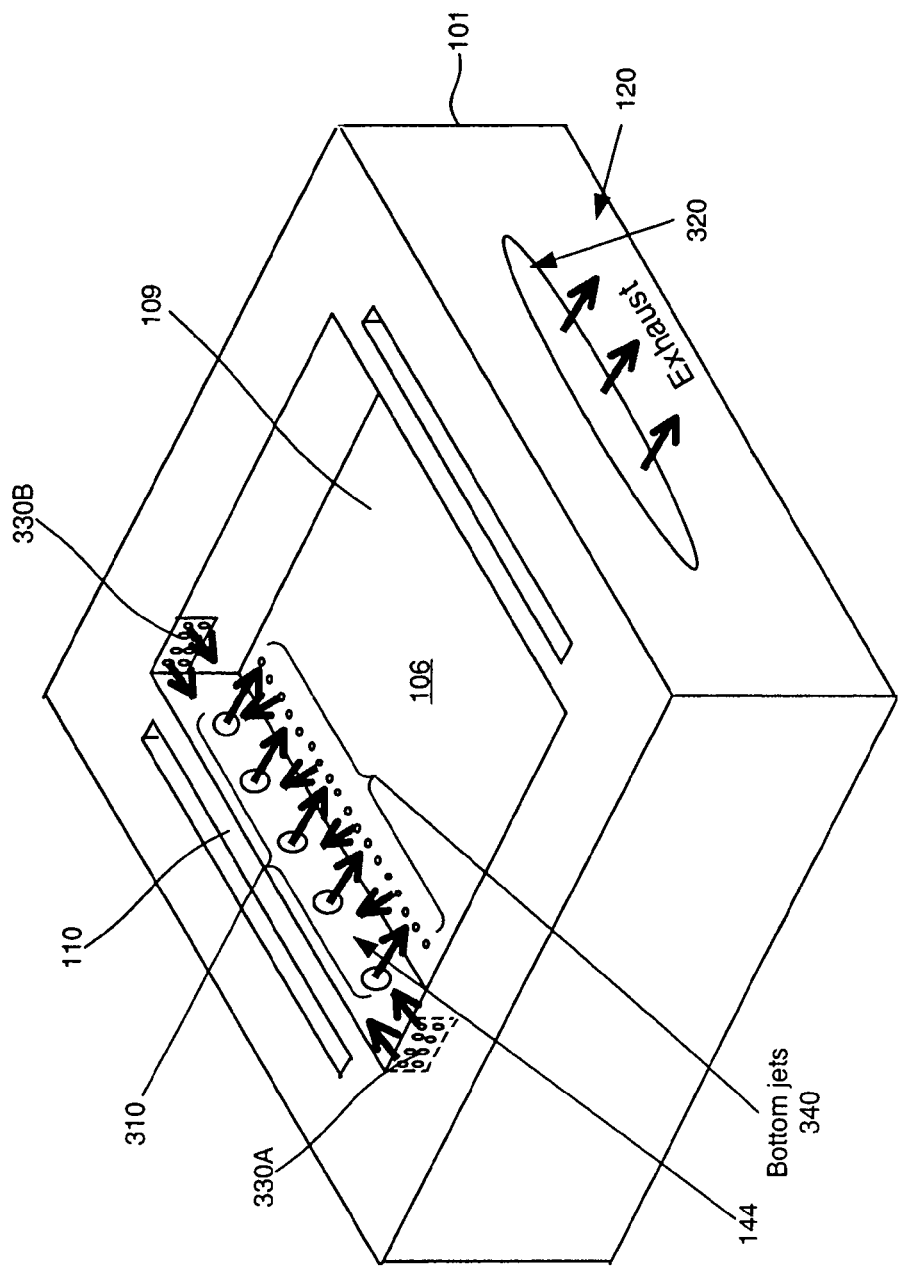

FIGS. 3B and 3C are diagrams showing perspective views of purging devices including non-contacting flow barriers 330A, 330B and 340 according to further embodiments of the present invention. As shown in FIG. 3B, flow barriers 330*a* and 330*b* are provided on the sides of base 101 at or near purge input interface 110, preferably on opposite sides of first pressure region 144. In one example, flow barriers 330A, 330B are made up of sets of jets ("corner jets") for impinging purging gas from sides of base 101 toward high pressure region 144 (FIG. 3B). Other types of non-contacting and/or contacting flow barriers can be used. Purging gas enters input ports 310 through purge input interface 110 and flows through pellicle volume 132 (not shown). However, part of the input purging gas can tend to flow to the sides of cavity 106. Such side leakage is undesirable as it tends to reduce the higher pressure within first pressure region 144 and leads to inefficiency in active purging of pellicle volume 132. Flow barriers 330*a*, 330*b* are provided to reduce or eliminate side leakage and keep the flow of purging gas along a direction into pellicle volume 132. In this way, purging gas flows efficiently through enclosed volume 132 toward output port 320 in purge output interface 120.

Flow barriers can also help reduce or eliminate bottom leakage from first pressure region 144 through gap 146 underneath pellicle 131. As shown in FIG. 3C, another flow barrier 340 can be provided on top surface 109 of base 101 at or near purge input interface 110, preferably below first pressure region 144. In one example, flow barrier 340 includes a set of jets ("bottom jets") for impinging purging gas from top surface 109 of base 101 toward high pressure region 144 as shown in FIG. 3C. Other types of non-contacting and/or contacting flow barriers can be used. Purging gas enters input ports 310 through purge input interface 110 and flows through pellicle volume 132 (not shown). However, part of the input purging gas can tend to flow along the bottom surface 109 of cavity 106. Like side leakage, such bottom leakage can be undesirable as it tends to reduce the higher pressure within first pressure region 144 and leads to inefficiency in active purging of pellicle volume 132. In purge device 101 of FIG.

3C, flow barriers 330a, 330b and 340 are provided to reduce or eliminate side and bottom leakages and keep flow of purging gas along a direction through pellicle volume 132. In this way, purging gas flows efficiently through enclosed volume 132 toward output port 320 in purge output interface 120.

In addition, in still further embodiments of the present invention, purge device 101 can perform active purging using flow barriers alone (such as flow barriers 330A, 330B and/or 340) and omit purge input interface 110 and ports 310.

Non-Contacting Type Flow Barriers

Figure 4A:
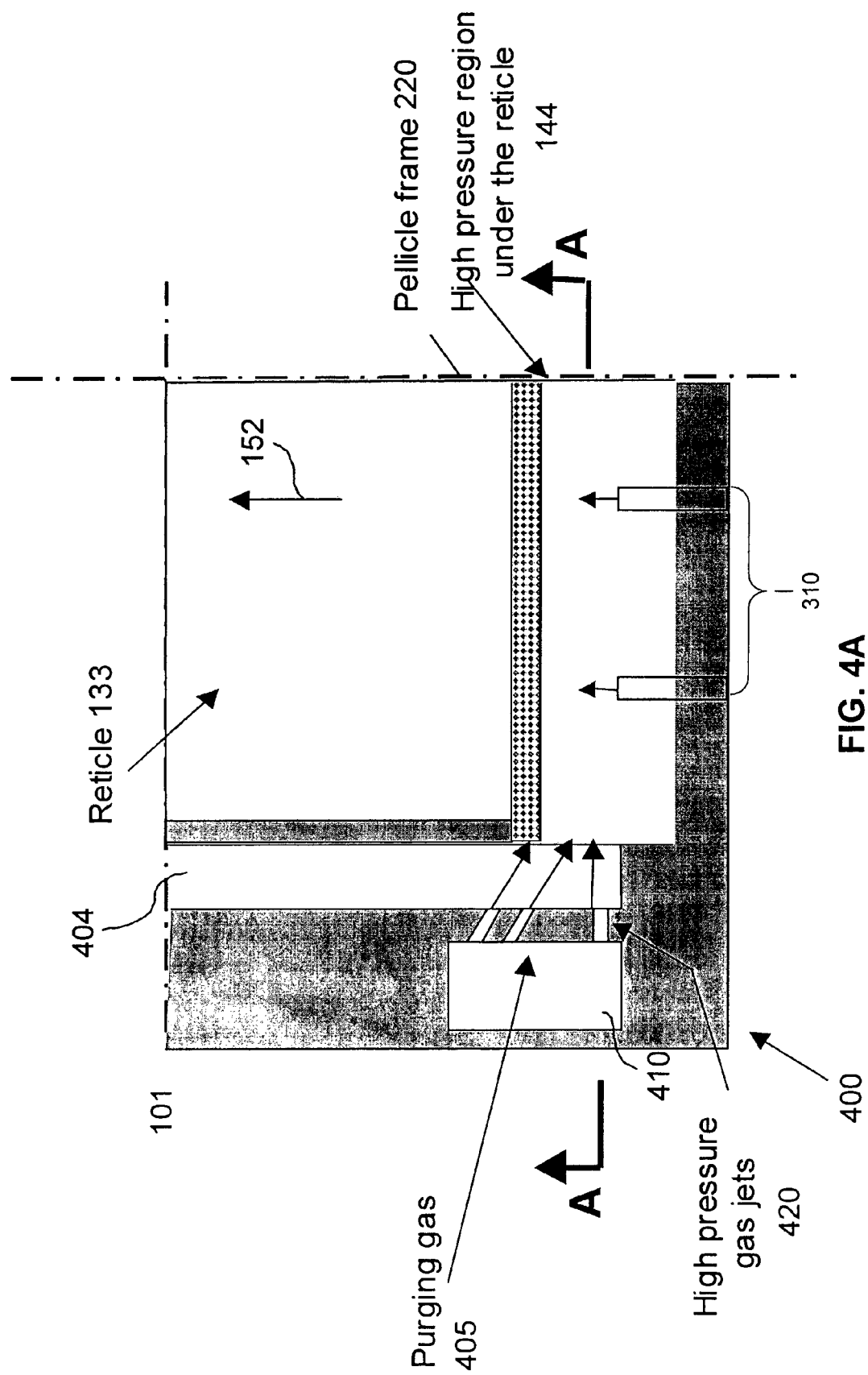
FIGS. 4A and 4B are diagrams of a non-contacting flow barrier according to an embodiment of the present invention.
Figure 4B:
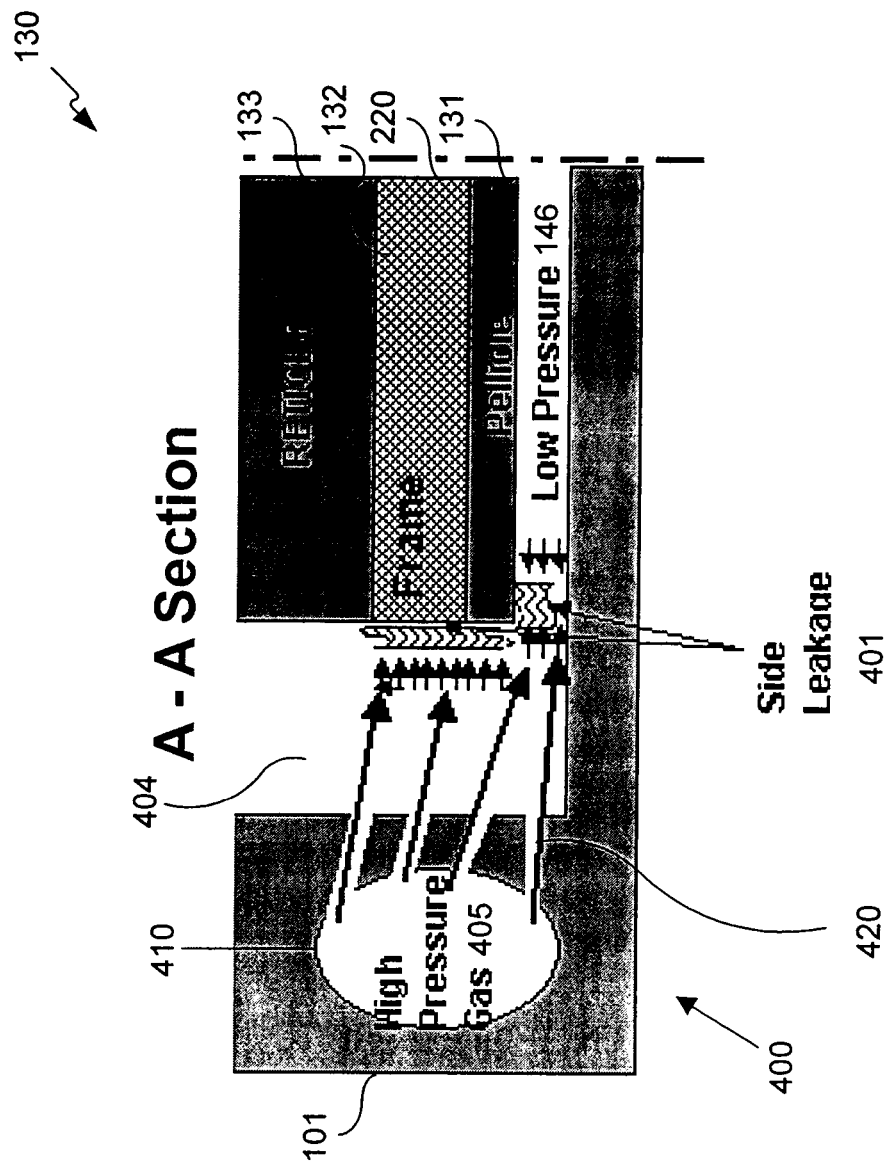

FIGS. 4A and 4B are top and side views of a non-contacting flow barrier 400 according to an embodiment of the present invention. Non-contacting flow barrier 400 is provided at a side of base 101 in a corner near high pressure region 144. Non-contacting flow barrier 400 includes chamber 410 and high pressure jets 420 embedded within base 101. A second flow barrier (not shown) can also be provided on the opposite end of high pressure region 144. Chamber 410 holds purging gas 405 at a high pressure. Purging gas 405 passes through high pressure gas jets 420 to a side region 404 at side cavity wall of base 101 near purge input interface 110 but underneath reticle 133. High pressure gas jets 420 direct purging gas 405 at pellicle frame 220 and gap region 146 to counter and prevent side leakage 401 from entering side region 404. High pressure gas jets 420 can direct purging gas 405 at different velocities as desired in a particular application.

In this way, during active purging, purging gas 150 that enters input ports 310 tends to flow along gas flow direction 152 and a high pressure is maintained at pressure region 144. Side leakage 401 is reduced or eliminated.

A gas supply and handling system (not shown) can be coupled to flow barrier 400. In particular, purging gas 405 can be provided by the same gas control and handling system that is providing purging gas 150. Preferably, the pressures, and flow rate of purging gas 150 and purging gas 405 can be independently controlled.

Contacting Type of Flow Barriers

Figure 5A:
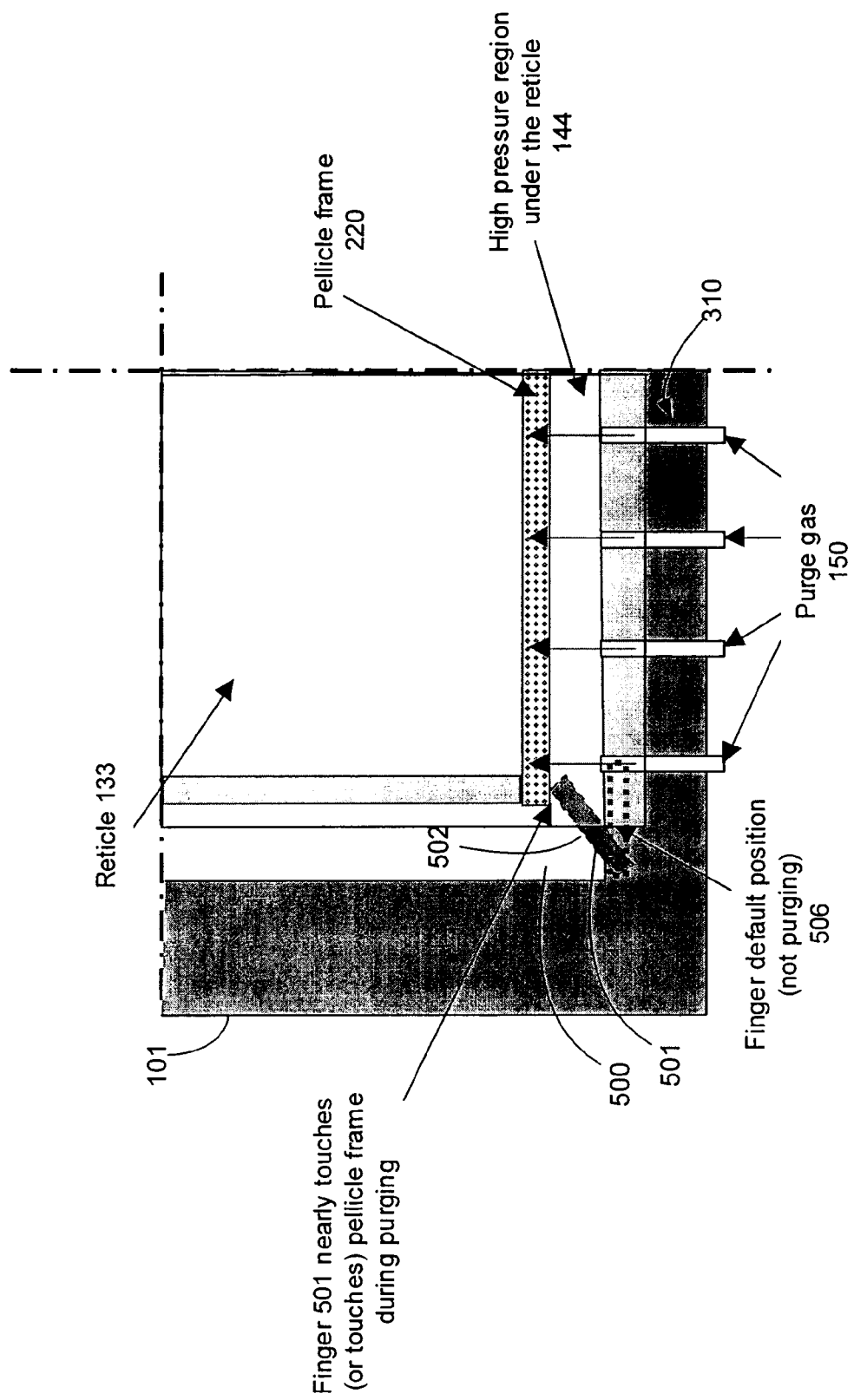
FIG. 5A is a diagram showing a top view of a contacting flow barrier at a high pressure region under a reticle according to the present invention.
Figure 5B:
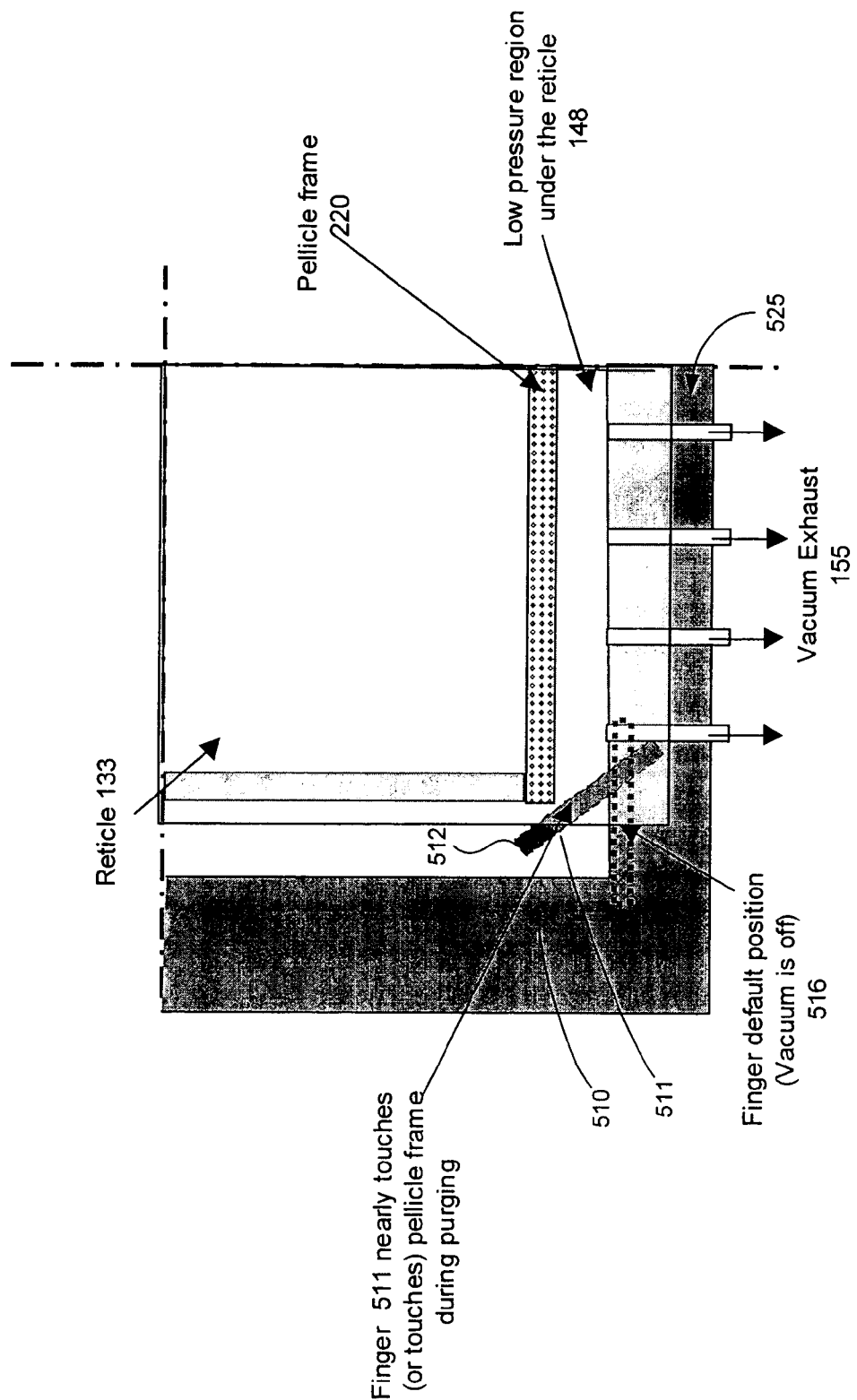
FIG. 5B is a diagram showing a top view of a contacting flow barrier at a low pressure region under a reticle according to the present invention.
Figure 6:
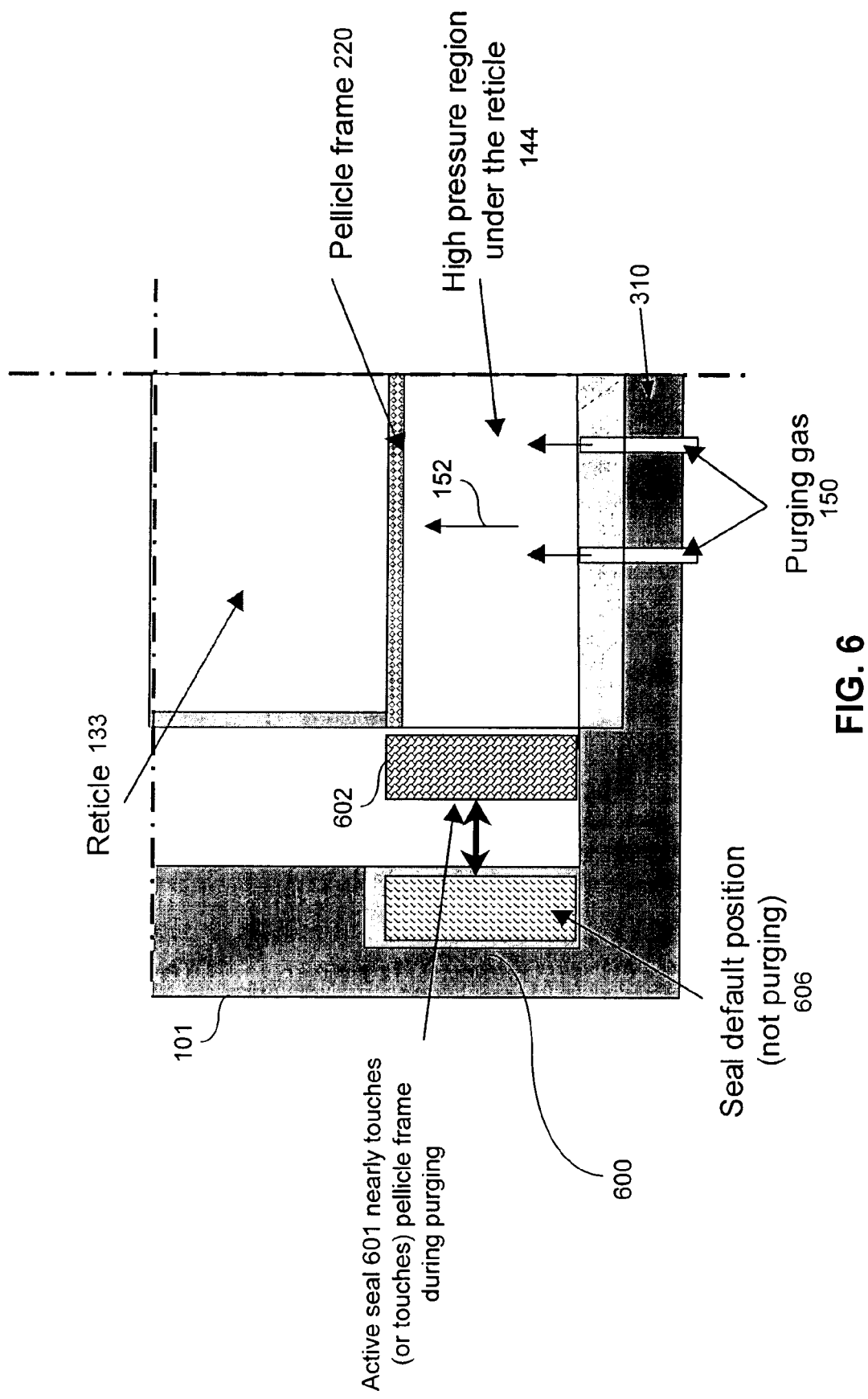
FIG. 6 is a diagram showing a top view of a contacting flow barrier at a high pressure region under a reticle according to an embodiment of the present invention.

FIGS. 5A, 5B and 6 are diagrams of example contacting flow barriers in purge devices, according to embodiments of the present invention. FIG. 5A is a diagram of a contacting flow barrier 500 positioned at a corner of base 101 at an end of high pressure region 144. Contacting flow barrier 500 includes an active finger 501. Active finger 501 is movable between a closed position 502 and an open position 506. When active finger 501 is in a closed position 502 it touches or nearly touches pellicle frame 220 during active purging. In this way active finger 501 provides a physical barrier to prevent side leakage from pellicle frame 220 and/or gap region 146 during active purging. Base 101 further includes a recess for receiving active finger 501 when it is in the open position (also called the default position) when active purging is not being performed.

FIG. 5B is a diagram of a contacting flow barrier 510 positioned at a corner of base 101 at an end of low pressure region 148. Contacting flow barrier 510 includes an active finger 511. Active finger 511 is movable between a closed position 512 and an open position 516. When active finger 511 is in a closed position 512 it touches or nearly touches pellicle frame 220 during active purging. In this way active finger 511 provides a physical barrier to prevent side leakage from pellicle frame 220 and/or gap region 146 during active purging, and is especially helpful when a vacuum connection is present. Purging gas flows efficiently from low pressure region 148 out through ports 525 to exit as vacuum exhaust 155. Base 101 further includes a recess for receiving active finger 511 when it is in the open position (also called the default position) when active purging is not being performed and a vacuum seal is off.

FIG. 6 is a diagram of a contacting flow barrier 600 according to a further embodiment of the present invention. Contacting flow barrier 600 includes an active seal 601 that moves between a closed position 602 and an open position 606. When active seal 601 is at closed position 602, active seal 601 touches or nearly touches pellicle frame 220. In this way, active seal 601 in a closed position acts as a physical barrier to prevent side leakage from pellicle frame 220 and/or gap region 146 during active purging. Base 101 further includes a recess for receiving active seal 601 in the open position (also called a default position) when active purging is not being conducted. Even though flow barriers 500, 600 are contacting type barriers, contact, if any, is made at a corner of pellicle frame 220 on a side face—not a face along the imaging path, such as a face of reticle 133 or pellicle 131.

In additional embodiments, non-contacting flow barriers 330A, 330B, 400 and contacting flow barriers 500, 600 can be provided anywhere along base 101 including but not limited to the corners. The present invention is not intended to be limited to these examples. Any combination of non-contacting flow barriers 330A, 330B, 400 and/or contacting flow barriers 500, 600 can be used. Other types of non-contacting and/or contacting flow barriers can be used in purge device 101 as would be apparent to a person skilled in the art given this description.

Flow Control Plates

According to a further feature of the present invention, one or more flow control plates are provided within a purge device cavity. Flow control plates can include a pressure balancing plate and/or a flow resistant plate. A flow control plate can be a single plate or a combination of plates. A single plate can have one or more regions made up of flow resistant plates and/or pressure balance plates. Alternatively, a flow control plate can be made up of multiple flow resistant and/or pressure balancing plates.

Figure 7A:
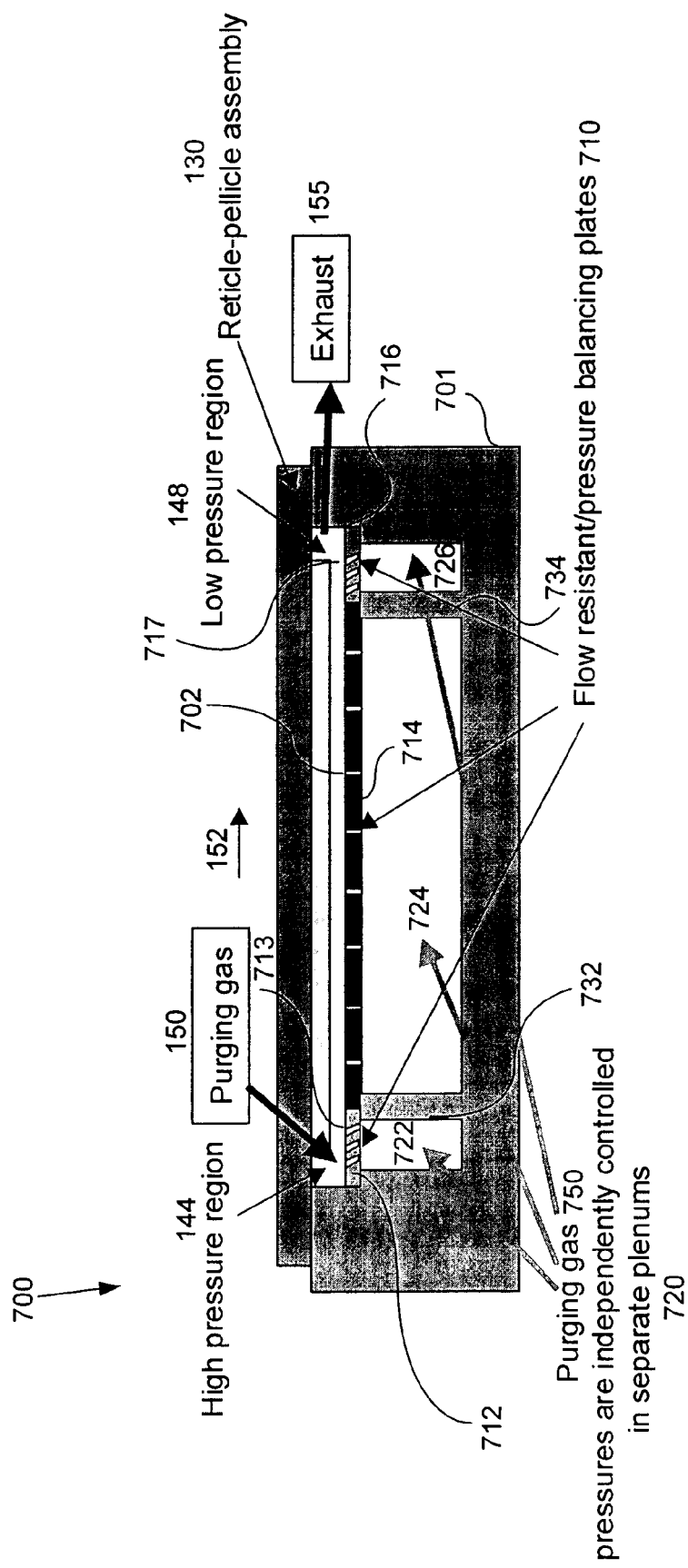
FIG. 7A is a diagram showing a side view of a purge device with a pressure balancing mechanism according to a further embodiment of the present invention.

FIG. 7A is a cross-sectional diagram of a purge device 700 having flow control plates 710 according to a further embodiment of the present invention. Flow control plate 710 includes a first flow resistant plate 712, a pressure balancing plate 714, and a second flow resistant plate 716. Base 701 includes first and second support members 732, 734 for supporting flow control plates 710 within a cavity in base 701. In one embodiment, first and second support members 732, 734 are made up of one or more dividing walls in base 701. These dividing walls divide cavity area within base 701 to form a central plenum and outer plenums 722, 726. Purging gas 750 can be introduced in plenums 722, 724, 726. A gas supply and handling system (not shown) can be used to provide a desired pressure and flow rate of purging gas 750 into each of plenums 722, 724, 726. In one embodiment, purging gas 750 can be provided by a common gas supply handling system that is handling purging gas 150 and non-contacting flow barrier purging gas 405.

Pressure balance plate 714 has a series of holes 702 formed therethrough. In embodiments, holes 702 can be distributed evenly or unevenly across pressure balance plate 714 depending on a particular gas flow and pressure distribution desired across pressure balance plate 714. Holes 702 can have the same or different diameters. Holes 702 can also have a orientation which is perpendicular with respect to pressure balance plate 714 or it can be angled in one or more different angles depending on a particular flow direction that is desired. During active purging, purging gas 150 flows through enclosed pellicle volume 132 along purging flow direction 152. Purging gas 750 is provided in central plenum 724 below pressure balance plate 714. In this way, purging gas 750 can flow through holes 702 and provide a balancing pressure to pellicle 131 of reticle-pellicle assembly 130. This further serves to reduce or eliminate displacement forces across pellicle 131 that might damage or rupture pellicle 131.

Figure 7B:
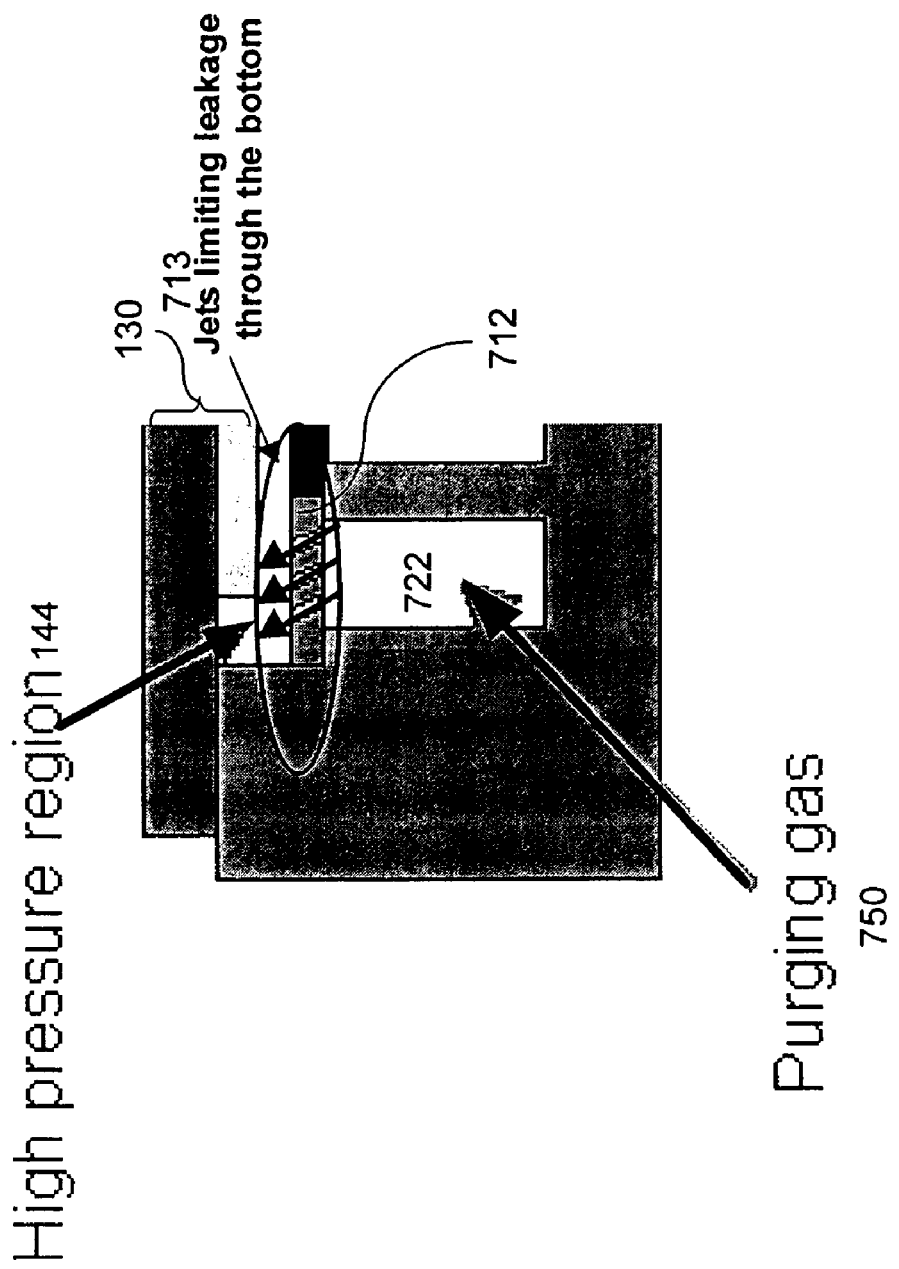
FIG. 7B is a diagram illustrating gas flow through a flow-resistant plate in the pressure balancing mechanism of the purge device of FIG. 7A in further detail.

Flow resistance plates 722, 726 each have a set of holes formed therethrough that allow purging gas 750 to flow from plenums 722, 726 toward high pressure region 144 and low pressure region 148 respectively. FIG. 7B shows holes 713 (also called jets) in flow resistance plate 712. Holes 713 are angled relative to flow resistant plate 712 such that purging gas 750 flows through angled holes 713 toward high pressure region 144 and resists any flow of purging gas 150. In particular, flow resistance is provided such that purging gas 150 tends to have a high pressure at high pressure region 144 and flow into and through enclosed volume 132 along purging flow direction 152—not under the bottom of reticle-pellicle assembly 130.

Similarly, as shown in FIG. 7A, holes 717 in flow resistance plate 716 are angled such that the flow of purging gas 750 from outer plenum 726 tends to resist the flow of purging gas toward low pressure region 148. In this way, the pressure differential between high pressure region 144 and low pressure region 148 is helped to be maintained and purging gas is directed to flow through pellicle volume 132. Angled holes 713, 717 can be angled in any desired angle depending on a particular flow resistance that is desired. A smaller or a greater number of angled holes can be provided and different diameters can be provided at different spacings depending on a particular flow resistance or application as desired.

FIG. 8 shows a cross-sectional view of purge device 800 having a base 801 with a height adjustable pressure balancing mechanism, according to a further embodiment of the present invention. Base 801 includes first and second support members 832, 834 for supporting flow resistance plates 712, 716 respectively. Base 801 further includes height adjustable supports 842, 844 for supporting pressure balancing plate 714 according to a further feature of the present invention. Supports 842 and 844 have an adjustable height. As a result, the location of pressure balancing plate 714 relative to pellicle surface 131 can be adjusted by varying the height of support members 842, 844. This is especially helpful when actively purging a flexible pellicle or sets of pellicles with varying flexibility. Depending on the particular type of material used in pellicle 131, pellicle 131 may stretch or be displaced during active purging. Such stretching or displacement can occur satisfactorily within a tolerance range of the pellicle 131 but still be undesirable if contact is made with plate 714. According to this feature, the location of pressure balancing plate 714 is adjusted by varying the heights of supports 842, 844 so that pellicle 131 does not contact plate 714. In this way, as shown in FIG. 8, the location of pressure balancing plate 714 can be adjusted to accommodate displacements in pellicle 131 during active purging.

While specific embodiments of the present invention have been described above, it should be understood that they have been presented by way of example only, and not limitation. It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A purge device for actively purging a pellicle volume enclosed within a reticle-pellicle assembly, the reticle-pellicle assembly having a reticle with a bottom portion, a pellicle, and a gas permeable pellicle frame, the gas permeable pellicle frame supporting the pellicle at a standoff from the reticle, the purge device comprising:
    a base having a purge input interface and a cavity, and
    at least one plate within the cavity of said base and extending parallel with the pellicle such that a gap region is formed between a surface of said at least one plate and said pellicle; said at least one plate including a pressure balancing plate having a set of holes;
    wherein said base includes one or more support members having an adjustable height that extend within said cavity to form a first plenum below said set of holes in said pressure balancing plate;
    wherein said cavity is configured to receive at least a portion of the reticle-pellicle assembly including a pellicle and the enclosed pellicle volume such that a first region within the cavity is formed at the purge input interface, a second region within the cavity is formed at a permeable side of the pellicle frame away from the first region, and said gap region is formed between the pellicle and a surface of the cavity, and purging gas sent through the purge input interface is kept at a higher pressure in the first region relative to the second region such that the purging gas flows through the enclosed pellicle volume and said gap region, whereby, a displacement force on the pellicle due to a pressure difference between purging gas in the enclosed volume and purging gas in the gap region is within a tolerance range of the pellicle.

2. The device of claim 1, wherein said at least one support member supports the reticle-pellicle assembly.

3. The device of claim 1, wherein said base includes at least one holding member that holds the reticle-pellicle assembly onto the base.

4. The device of claim 3, wherein said holding member comprises a vacuum groove

5. The device of claim 1, wherein the pellicle frame is permeable to gas and impermeable to particles.

6. The device of claim 5, wherein the pellicle frame includes at least two sides permeable to gas arranged within said cavity such that at least one permeable side faces the first region and another permeable side faces the second region.

7. The device of claim 5, wherein the pellicle frame comprises:
    a first pair of opposing sides permeable to gas and arranged within said cavity such that one permeable side of said first pair faces the first region and the other permeable side of said first pair faces the second region; and
    a second pair of opposing sides impermeable to gas and arranged within said cavity such that one impermeable side of said second pair faces a first cavity wall between the first region and the second region and the other impermeable side of said second pair faces a second cavity wall between the first region and the second region opposite said first cavity wall.

8. The device of claim 5, wherein the purging gas includes nitrogen and the pellicle frame is permeable to nitrogen.

9. The device of claim 1, wherein said purge input interface includes at least one port for passing the purging gas to the first region.

10. The device of claim 1, further comprising a purge output interface having at least one port for passing exhaust out of the purge device.

11. The device of claim 1, wherein the cavity comprises a rectangular volume within said base.

12. The device of claim 1, wherein the first region is substantially enclosed by a permeable side of the pellicle frame, the purge input interface, a surface of the reticle, a top surface of the base, and side walls of the cavity.

13. The device of claim 1, further comprising a flow barrier that keeps the flow of the purging gas within the first region before entering the pellicle volume.

14. The device of claim 13, further comprising another flow barrier that keeps the flow of the purging gas within the second region as it exits the pellicle volume.

15. A purge device for actively purging a pellicle volume enclosed within a reticle-pellicle assembly, the reticle-pellicle assembly having a reticle, a pellicle, and a gas permeable pellicle frame, the gas permeable pellicle frame supporting the pellicle at a standoff from the reticle, the purge device comprising:

a base having a purge input interface and a cavity,
wherein said cavity receives at least a portion of the reticle-pellicle assembly including a pellicle and the enclosed pellicle volume such that a first region within the cavity is formed at the purge input interface, a second region within the cavity is formed at a permeable side of the pellicle frame away from the first region, and a gap region is formed between the pellicle and a surface of the cavity, and purging gas sent through the purge input interface is kept at a higher pressure in the first region relative to the second region such that the purging gas flows through the enclosed pellicle volume and said gap region, whereby, a displacement force on the pellicle due to a pressure difference between purging gas in the enclosed volume and purging gas in the gap region is within a tolerance range of the pellicle; and a flow barrier that keeps the flow of the purging gas within the first region before entering the pellicle volume, wherein said flow barrier comprises a non-contacting gas barrier.

16. The device of claim 15, wherein said non-contacting gas barrier comprises two groups of jets that direct additional purging gas toward opposite sides of the first region.

17. The device of claim 15, wherein said non-contacting gas barrier comprises two groups of jets that direct additional purging gas upon opposite sides of the first region and another group of jets that direct additional purging gas against the flow going through the gap region under the pellicle.

18. The device of claim 15, wherein said non-contacting gas barrier further includes several gas chambers and groups of jets that direct additional purging gas at different velocities.

19. A purge device for actively purging a pellicle volume enclosed within a reticle-pellicle assembly, the reticle-pellicle assembly having a reticle, a pellicle, and a gas permeable pellicle frame, the gas permeable pellicle frame supporting the pellicle at a standoff from the reticle, the purge device comprising:

a base having a purge input interface and a cavity,
wherein said cavity receives at least a portion of the reticle-pellicle assembly including a pellicle and the enclosed pellicle volume such that a first region within the cavity is formed at the purge input interface, a second region within the cavity is formed at a permeable side of the pellicle frame away from the first region, and a gap region is formed between the pellicle and a surface of the cavity, and purging gas sent through the purge input interface is kept at a higher pressure in the first region relative to the second region such that the purging gas flows through the enclosed pellicle volume and said gap region, whereby, a displacement force on the pellicle due to a pressure difference between purging gas in the enclosed volume and purging gas in the gap region is within a tolerance range of the pellicle; and at least one plate within the cavity of said base and extending parallel with the pellicle such that said gap region is formed between a surface of said at least one plate and said pellicle, wherein said at least one plate includes a pressure balancing plate having a set of holes, wherein said base includes one or more dividing walls that extend within said cavity to form a first plenum below said set of holes in said pressure balancing plate.

20. The device of claim 19, wherein said at least one plate further includes a first flow resistant plate arranged along a front of the gap region at or near said first region; and a second flow resistant plate arranged along a back of the gap region at or near said second region.

21. The device of claim 19, wherein said one or more dividing walls further extend within said cavity to form second and third plenums below said first and second flow resistant plates respectively, whereby, pressure of a purging gas in the second and third plenums can be controlled to provide a flow resistance within the gap region that tends to direct a purging gas flow from the purge input interface through the enclosed pellicle volume.

22. A purge device for actively purging a pellicle volume enclosed within a reticle-pellicle assembly, the reticle-pellicle assembly having a reticle, a pellicle, and a gas permeable pellicle frame, the gas permeable pellicle frame supporting the pellicle at a standoff from the reticle, the purge device comprising:

a base having a cavity formed therein, wherein said cavity receives at least a portion of the reticle-pellicle assembly including a pellicle and the enclosed pellicle volume such that a first region within the cavity is formed, said first region being capable of holding a purging gas at a high pressure;

at least one plate within the cavity of said base and extending parallel with the pellicle such that a gap region is formed between a surface of said at least one plate and said pellicle: said at least one plate including a pressure balancing plate having a set of holes;

wherein said base includes one or more support members having an adjustable height that extend within said cavity to form a first plenum below said set of holes in said pressure balancing plate; and a flow barrier constructed and arranged to keep the flow of the purging gas within the first region at a high pressure as it enters the enclosed pellicle volume.

23. A purge device for actively purging a pellicle volume enclosed within a reticle-pellicle assembly, the reticle-pellicle assembly having a reticle, a pellicle, and a gas permeable pellicle frame, the gas permeable pellicle frame supporting the pellicle at a standoff from the reticle, the purge device comprising:

a base having a cavity formed therein, wherein said cavity receives at least a portion of the reticle-pellicle assembly including a pellicle and the enclosed pellicle volume such that a first region within the cavity is formed, said first region being capable of holding a purging gas at a high pressure; and a flow barrier that keeps the flow of the purging gas within the first region at a high pressure as it enters the enclosed pellicle volume, wherein said flow barrier comprises a non-contacting gas barrier.

24. The device of claim 23, wherein said non-contacting gas barrier comprises two groups of corner jets disposed within corners of said base that direct additional purging gas toward opposite sides of the first region.

25. The device of claim 24, wherein said non-contacting gas barrier further includes a third group of bottom jets disposed at a top surface of said base that direct additional purging gas against a flow of the purging gas traveling in a gap under the pellicle.

* * * * *

UNITED STATES PATENT AND TRADEMARK OFFICE
CERTIFICATE OF CORRECTION

PATENT NO. : 7,619,718 B2  Page 1 of 1
APPLICATION NO. : 10/679324
DATED : November 17, 2009
INVENTOR(S) : Luo et al.

It is certified that error appears in the above-identified patent and that said Letters Patent is hereby corrected as shown below:

Title Page, item (75), inventors, please add "Ci" before "Florence".
Title Page, item (75), inventors, please replace "H" with "Hilary".
In Claim 4, Column 10, Line 39, please add "." after "groove".

Signed and Sealed this

Second Day of February, 2010

David J. Kappos
*Director of the United States Patent and Trademark Office*